United States Patent
Cheng et al.

(10) Patent No.: US 12,557,223 B2
(45) Date of Patent: Feb. 17, 2026

(54) FABRICATING FUNCTIONAL CIRCUITS ON 3D FREEFORM SURFACES VIA INTENSE PULSED LIGHT-INDUCED ZINC MASS TRANSFER

(71) Applicant: The Penn State Research Foundation, University Park, PA (US)

(72) Inventors: Huanyu Cheng, University Park, PA (US); Ning Yi, University Park, PA (US)

(73) Assignee: THE PENN STATE RESEARCH FOUNDATION, University Park, PA (US)

( * ) Notice: Subject to any disclaimer, the term of this patent is extended or adjusted under 35 U.S.C. 154(b) by 204 days.

(21) Appl. No.: 18/561,934

(22) PCT Filed: Mar. 30, 2022

(86) PCT No.: PCT/US2022/022447
§ 371 (c)(1),
(2) Date: Nov. 17, 2023

(87) PCT Pub. No.: WO2022/250781
PCT Pub. Date: Dec. 1, 2022

(65) Prior Publication Data
US 2024/0276648 A1    Aug. 15, 2024

Related U.S. Application Data

(60) Provisional application No. 63/193,821, filed on May 27, 2021.

(51) Int. Cl.
*H05K 3/14* (2006.01)
*A61B 5/28* (2021.01)
(Continued)

(52) U.S. Cl.
CPC ............ *H05K 3/143* (2013.01); *A61B 5/28* (2021.01); *A61B 5/296* (2021.01); *H05K 1/092* (2013.01);
(Continued)

(58) Field of Classification Search
CPC ........ H05K 3/143; H05K 1/092; H05K 3/146; H05K 2203/0156; H05K 2203/0557;
(Continued)

(56) References Cited

U.S. PATENT DOCUMENTS 5,826,329 A * 10/1998 Roth .................. H05K 3/207
29/830
6,177,151 B1 * 1/2001 Chrisey ................ C23C 14/048
219/121.85
(Continued)

FOREIGN PATENT DOCUMENTS

WO    WO-2006076613 A2 *  7/2006  ............. B22F 1/054

OTHER PUBLICATIONS

Tang et al. "Programmable active kirigami metasheets with more freedom of actuation." PNAS, 2019, pp. 1-7.
(Continued)

*Primary Examiner* — Donghai D Nguyen
(74) *Attorney, Agent, or Firm* — Troutman Pepper Locke LLP

(57) ABSTRACT

The invention includes methods of forming electronic circuitry on a target surface using intense pulsed light-induced mass transfer (IPLMT) of metal nanoparticles (NPs) by applying a pliable mask to a target surface, coating a carrier film with metal NPs, mounting the carrier film to the target surface and over the pliable mask so that the pliable mask is sandwiched between the target surface and the metal NPs. and exposing the metal NPs to light energy to cause atoms of the metal NPs to evaporate and transport through open-
(Continued)

ings of the pliable mask and condense on the target surface, producing a conductive pattern of condensed metal on the target surface. Certain implementations may utilize a kirigami-patterned pliable mask to enhance conformity to a freeform 3D target surface. In certain implementations, zinc (Zn) may be formed by IPLMT of Zn NPs to the target surface.

9 Claims, 8 Drawing Sheets

(51) Int. Cl.
*A61B 5/296* (2021.01)
*H05K 1/09* (2006.01)

(52) U.S. Cl.
CPC ..... *H05K 3/146* (2013.01); *H05K 2203/0156* (2013.01); *H05K 2203/0557* (2013.01); *H05K 2203/083* (2013.01); *H05K 2203/1131* (2013.01); *H05K 2203/1173* (2013.01)

(58) Field of Classification Search
CPC .... H05K 2203/083; A61B 5/28; A61B 5/296; C23C 14/048; Y10T 29/49155; Y10T 29/49163
See application file for complete search history.

(56) References Cited

U.S. PATENT DOCUMENTS

| | | | |
|---|---|---|---|
| 8,728,589 B2* | 5/2014 | Auyeung | H05K 3/046 427/595 |
| 10,470,312 B2 | 11/2019 | Yoshihara et al. | |
| 11,066,296 B1 | 7/2021 | Uz et al. | |
| 2005/0207930 A1 | 9/2005 | Yamaguchi | |
| 2006/0158470 A1 | 7/2006 | Vanheusden et al. | |
| 2010/0000762 A1 | 1/2010 | Yang et al. | |

OTHER PUBLICATIONS

International Search Report and Written Opinion mailed Jul. 26, 2022 in related International Patent Application No. PCT/US2022/022447.
Yi, et al., "Fabricating functional circuits on 3D freeform surfaces via intense pulsed light-induced zinc mass transfer," Materials Today, vol. 50, Nov. 2021, pp. 24-34, ISSN 1369-7021.

* cited by examiner

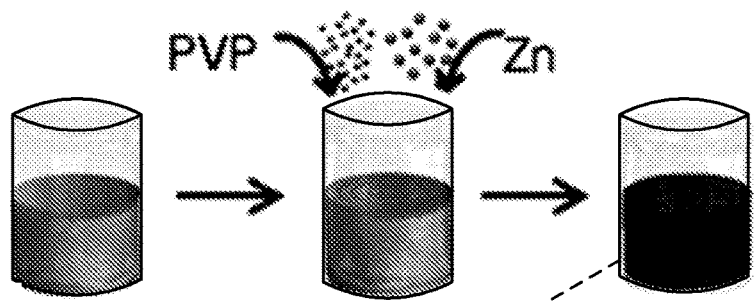
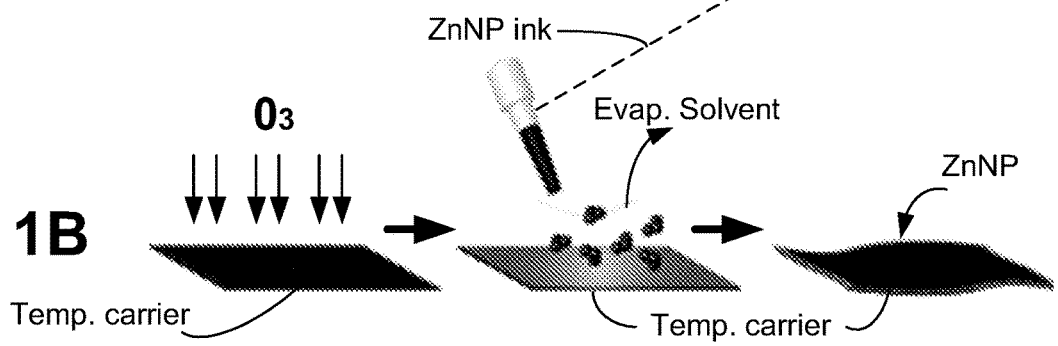
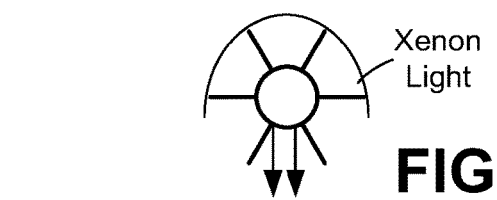
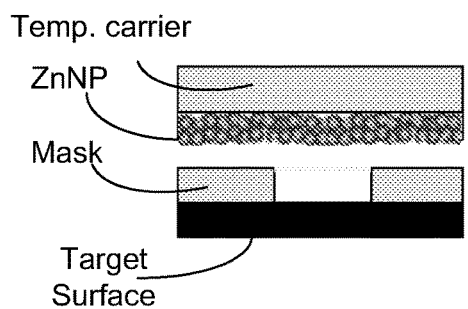
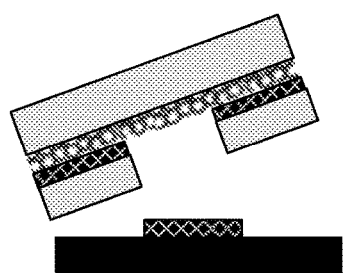
FIG. 1A
FIG. 1B
FIG. 1C
FIG. 1D
FIG. 1E

FABRICATING FUNCTIONAL CIRCUITS ON 3D FREEFORM SURFACES VIA INTENSE PULSED LIGHT-INDUCED ZINC MASS TRANSFER

CROSS-REFERENCE TO RELATED APPLICATIONS

This application is a national phase filing under 35 U.S.C. § 371 of International Patent Application No. PCT/US2022/022447, filed on Mar. 30, 2022, which claims priority to U.S. Provisional Patent Application No. 63/193,821, filed on May 27, 2021, both entitled FABRICATING FUNCTIONAL CIRCUITS ON 3D FREEFORM SURFACES VIA INTENSE PULSED LIGHT-INDUCED ZINC MASS TRANSFER, each of which is incorporated herein by reference in its entirety.

GOVERNMENT SUPPORT

This invention was made with government support under Grant No. ECCS1933072 awarded by the National Science Foundation and under Grant No. HL154215 awarded by the National Institutes of Health. The Government has certain rights in the invention.

FIELD OF THE DISCLOSURE

The various embodiments of the present disclosure relate generally to electronic circuitry, and in particular, to forming functional circuits on a three-dimensional surface using pulsed light-induced mass transfer of zinc nanoparticles.

BACKGROUND

Currently, most electronic devices are fabricated by vacuum-based integrated circuit processes, screen printing, or additive manufacturing methods, all of which require a planar substrate for patterning functional materials. Because a convex or concave surface is not compatible with lithography processes and traditional printers, the technique of transfer printing has been explored for heterogeneous integration of the thin film electronics onto curvilinear structures. In addition to the complicated fabrication processes, the electronics also need to be flexible and moldable to ensure robust performance over the shape transformation.

To achieve direct fabrication of electronic circuits on an arbitrary shape, advanced printing techniques have been developed, including omnidirectional printing, aerosol jet printing, and adaptive 3D printing. However, disadvantages still exist for these direct writing methods. Omnidirectional printing relies on the precise motion control of the printing head and a perfect match between the target surface and the printing path. Therefore, it is only achieved for a known regular surface because the printing quality can be affected if there is a mismatch between the actual surface and the moving path of the printing head. High-resolution scanning of the target surface is necessary for other arbitrary surfaces.

The design of ink formulations and the exploration of bending nozzles with specific angles are also needed to ensure successful dispensing of the ink onto the surface. Unlike other direct-write printing processes, aerosol jet printing is a non-contact process where the ink droplets are jet onto the target substrate through an aerodynamic process. Although aerosol jet printing has a larger tolerance for the working distance (i.e., the gap between the printing head and target substrate), the working distance variation can also exert influence on the uniformity of the printed features, causing poorly defined edges and overspray. Because it is an aerodynamic process, aerosol jet printing also suffers from the splash of sprinkles, which causes a fuzzy edge along the printed line.

To address the geometry variation in the target surface, adaptive 3D printing methods have been developed to explore a closed-loop feedback system to automatically adjust the printing head position, which also allows the 3D printer to print conductive silver ink onto moving freeform surfaces. However, the patterning accuracy and feature size are limited partially due to the requirement for the real-time high-accuracy scanning device. Furthermore, sintering of nanomaterials in the ink from these printing techniques often requires a high temperature, which is not compatible with soft elastomeric substrates commonly used in stretchable/wearable electronics.

Traditionally, transient electronic circuit production has relied on vacuum-based deposition tools (e.g., E-beam evaporation or magnetron sputtering), which can be time-consuming due to the associated long pumping time to achieve high vacuum level, and which can cause contamination to subsequent samples, and is typically limited to planar 2D surfaces.

Most of these prior printing techniques have used noble metal nanomaterials such as silver, copper, and carbon-based inks such as graphene. The electronic waste generated as a direct result of these techniques has been increasing at an accelerated rate every year, causing environmental concerns and health issues as they penetrate our ecosystem.

While the fabrication of transient electronics has been attempted on flat substrates either with lithographic processes or printing approaches, there is still a need for direct writing of transient electronics on an arbitrary freeform 3D surface.

BRIEF SUMMARY

The disclosed technology relates to fabricating functional circuits on a 3D freeform surface, which is of significant interest to wearable devices on curvilinear skin/tissue surfaces or smart Internet-of-Things with sensors on 3D objects. The disclosed technology enables printing transient or long-lasting functional circuits onto freeform surfaces by intense pulsed light-induced mass transfer of zinc nanoparticles (Zn NPs). The intense pulsed light can locally raise the temperature of Zn NPs to cause evaporation.

Certain exemplary implementations of the disclosed technology include a method of forming an electronic circuit on a target surface using the intense pulsed light-induced mass transfer (IPLMT) of metal nanoparticles (NPs). The method includes coating a first side of a carrier film with metal NPs; applying a pliable mask to at least a portion of a target surface; mounting the coated first side of the carrier film to the target surface and the pliable mask so that the pliable mask is sandwiched between the target surface and the metal NPs; and exposing the metal NPs to light energy to cause atoms of the metal NPs to evaporate and transport through openings of the pliable mask and condense on the target surface, producing a conductive pattern of condensed metal on the target surface.

Certain exemplary implementations of the disclosed technology include an electronic circuit, comprising a pattern of electrically conductive traces formed on a three-dimensional (3D) structure, the traces defined by openings in a kirigami-patterned mask mounted to a surface of the 3D structure. At least a portion of the pattern of electrically conductive traces comprises one or more of zinc (Zn) formed by intense pulsed light-induced mass transfer of Zn nanoparticles (NPs) to the surface of the 3D structure; silver (Ag) formed through a replacement reaction by immersing the conductive pattern in a solution of silver nitrate; and copper (Cu) formed through a replacement reaction by immersing the conductive pattern in copper sulfate.

In certain implementations, the lamination of a kirigami-patterned soft semi-transparent polymer film with Zn NPs conforming to a 3D surface results in condensation of Zn NPs to form conductive yet degradable Zn patterns onto a 3D freeform surface for constructing transient electronics. The Zn patterns may then be immersed into a copper sulfate or silver nitrate solution can further convert the transient device to a long-lasting device with copper or silver conductors.

Certain exemplary implementations of the disclosed technology include a controllably transient degradable electronic circuit that includes a pattern of electrically conductive traces formed on a target surface, the traces defined by openings in a pliable mask mounted to the target surface. At least a portion of the pattern of electrically conductive traces includes a metal comprising one or more of Zn, Mg, Mo, and W, formed by intense pulsed light-induced mass transfer (IPLMT) of corresponding one or more Zn, Mg, Mo, and W nanoparticles (NPs) to the target surface, and an encapsulation layer covering at least a portion of the electrically conductive traces.

These and other aspects of the present disclosure are described in the Detailed Description below and the accompanying drawings. Other aspects and features of embodiments will become apparent to those of ordinary skill in the art upon reviewing the following description of specific, exemplary embodiments in concert with the drawings. While features of the present disclosure may be discussed relative to certain embodiments and figures, all embodiments of the present disclosure can include one or more of the features discussed herein. Further, while one or more embodiments may be discussed as having certain advantageous features, one or more of such features may also be used with the various embodiments discussed herein. Similarly, while exemplary embodiments may be discussed below as device, system, or method embodiments, it is to be understood that such exemplary embodiments can be implemented in various devices, systems, and methods of the present disclosure.

BRIEF DESCRIPTION OF THE DRAWINGS

The following detailed description of specific embodiments of the disclosure will be better understood when read in conjunction with the appended drawings. For the purpose of illustrating the disclosure, specific embodiments are shown in the drawings. It should be understood, however, that the disclosure is not limited to the precise arrangements and instrumentalities of the embodiments shown in the drawings.

FIG. 1A is an example illustration of preparing a zinc nanoparticle (Zn NP) ink by adding a surfactant (such as polyvinylpyrrolidone (PVP)) to a solvent (such as ethanol), in accordance with an exemplary embodiment of the disclosed technology.

FIG. 1B is an example illustration of a process for preparing and coating a temporary carrier film (such as polyimide (PI)) with Zn NPs. The film may be treated with ozone before applying the Zn NP ink to yield a uniformly coated temporary carrier layer, in accordance with an exemplary embodiment of the disclosed technology.

FIG. 1C is an example illustration of applying the temporary carrier layer onto the target surface with the Zn NPs layer facing the target substrate with a shadow mask sandwiched between the Zn NPs layer and the target surface.

FIG. 1D is an example illustration of using intense pulsed light to induce the mass transfer of Zn from the temporary carrier layer to the target surface, in accordance with an exemplary embodiment of the disclosed technology.

FIG. 1E is an example illustration of removal of the shadow mask and temporary carrier layer to leave behind a Zn pattern on the target surface, in accordance with an exemplary embodiment of the disclosed technology.

DETAILED DESCRIPTION

Figure 2A:
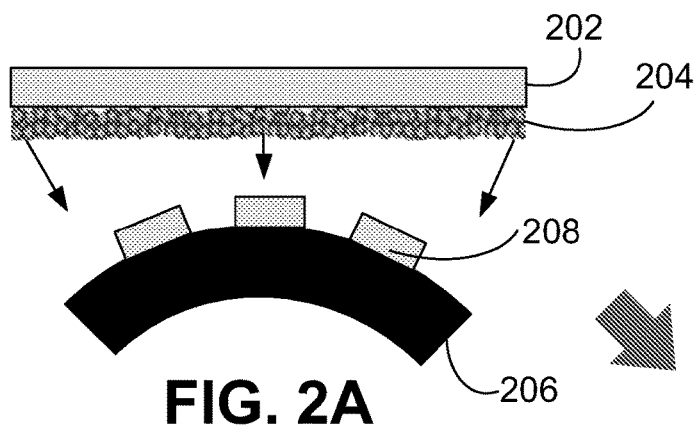
FIG. 2A is an example illustration of applying the temporary carrier layer onto a freeform 3D target surface with the Zn NPs layer facing the target substrate with a shadow mask sandwiched between the Zn NPs layer and the freeform 3D target surface.

The disclosed technology includes a novel approach to directly fabricate electronics on freeform surfaces through the use of intense pulsed light-induced mass transfer (IPLMT), leveraging the evaporation-condensation effect of metal nanoparticles (such as zinc) and intense pulsed light sintering, as discussed in Yi, et al., "Fabricating functional circuits on 3D freeform surfaces via intense pulsed light-induced zinc mass transfer," Materials Today, Volume 50, November 2021, Pages 24-34, ISSN 1369-7021, the contents of which are incorporated by reference as if presented in full.

The IPLMT process disclosed herein may be utilized to deposit Zn onto various types of flat and non-flat 3D freeform surfaces for constructing various types of circuits. The disclosed technology includes certain parameters that may enable the fabrication of conductive patterns for fabricating electronics on 3D complicated surfaces. A single-replacement reaction is further disclosed herein to convert a patterned Zn layer into long-lasting Cu or Ag. Additionally, a selective coating process is disclosed herein, for example, to control the transient operation of devices fabricated using the IPLMT process. The versatility of this powerful method has been showcased through a system-level demonstration with electronics that include antennas, electrodes, temperature sensors, and gas sensors on 3D surfaces for smart IoTs and integration on complicated biological surfaces. The methods disclosed herein may be utilized to generate circuits on complicated surfaces with well-controlled yet small feature sizes, overcoming several obstacles faced by traditional lithographic processes or various advanced printing approaches. As a result, the IPLMT process possesses a huge potential to create novel transient and long-lasting devices and systems for applications in a variety of fields including optoelectronics, telecommunication, and medicine.

Certain exemplary implementations of the disclosed technology may be utilized to mitigate or eliminate electronic waste by producing transient or degradable electronics that can dissolve to produce environmentally friendly and biologically safe and/or recyclable end products. The disclosed technology may enable manufacturing degradable electronics on freeform three-dimensional (3D) surfaces for applications such as stretchable/wearable electronics, antennas, curved circuit boards, epidermal sensors, implantable sensors, supercapacitors, therapeutic devices, etc.

Certain exemplary implementations of the disclosed technology may utilize conducting materials, semiconducting materials, insulating materials, and/or dielectric materials. Transient metals, such as zinc (Zn), magnesium (Mg), molybdenum (Mo), and/or tungsten (W), for example, may be utilized for forming conductors due to their good electrical conductivities and fast water dissolution rates. Zn, for example, is a trace metal that may serve as the conductive material for constructing transient electronics. In accordance with certain exemplary implementations of the disclosed technology, fabricated conductive patterns using one or more transient metals may be used as conductive traces, interdigitated electrodes, sensing components, antennas, smart Internet-of-Things (IoT) devices, etc., and may form building blocks for transient electronics on 3D freeform surfaces. Certain exemplary implementations of the disclosed technology may utilize an encapsulation layer on top of the transient circuits to protect the circuits and/or to program functional degradation thereof.

The IPLMT method, as disclosed herein, can directly and rapidly deposit Zn from the Zn NPs onto target 3D freeform surfaces in the ambient environment without a need for vacuum. The mass transfer of Zn leaves the native oxide layer behind in the Zn NPs, which leads to a significantly enhanced conductivity in the resulting Zn layers/patterns for circuit connections, sensors applications, high-efficiency microwave devices, etc.

Certain implementations of the disclosed IPLMT technology can be used to eliminate the need for high-resolution scanners and motion control systems (as used in the direct 3D printing methods) and may enable rapid and low-cost direct printing of transient sensors and circuits on a 3D complicated surface.

In accordance with certain exemplary implementations of the disclosed technology, the transient circuits produced with the disclosed IPLMT technology can also be conveniently converted into long-lasting circuits with noble metals such as Ag or Cu through a single replacement reaction by immersing the circuits into copper sulfate or silver nitrate solution followed by photonic sintering. The simple replacement process can also result in a higher conductivity in the long-lasting circuits compared to that of the transient embodiments.

The disclosed IPLMT technology may be compatible with (or use a similar setup as) roll-to-roll manufacturing of printed circuits through screen printing and photonic sintering for large-scale fabrication of printed circuits. Certain implementations of the disclosed technology may be more competitive compared to other printing methods by virtue of the rapid mass transfer of Zn to a given surface using intense pulsed light.

Referring now to the figures, exemplary embodiments of the disclosed technology are herein described. It is to be understood that the figures and descriptions of the disclosed technology have been simplified to illustrate elements that are relevant for a clear understanding, while eliminating, for purposes of clarity, other elements found in typical electronics circuits and associated devices. Those of ordinary skill in the art will recognize that other elements may be desirable and/or may be required to implement the disclosed technology. However, because such elements are well known in the art, and because they may not facilitate a better understanding, a discussion of such elements is not provided herein.

Figure 6:
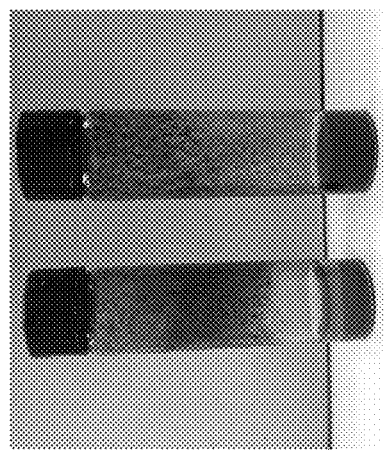
FIG. 6 depicts the stabilization of Zn NPs ink using a polyvinylpyrrolidone (PVP) surfactant. Sedimentation occurs in the Zn NPs ink without the addition of PVP (left), whereas the Zn NPs ink with PVP (right) remains homogeneous.

FIG. 1A is an example illustration of how a zinc nanoparticle (Zn NP) ink solution may be prepared by adding Zn NPs and a surfactant (such as polyvinylpyrrolidone (PVP)) to a solvent (such ethanol), in accordance with an exemplary embodiment of the disclosed technology. PVP can stabilize nanoparticles in the solvent to prevent aggregation and sedimentation, as shown in FIG. 6 (right vial).

Figure 7B:
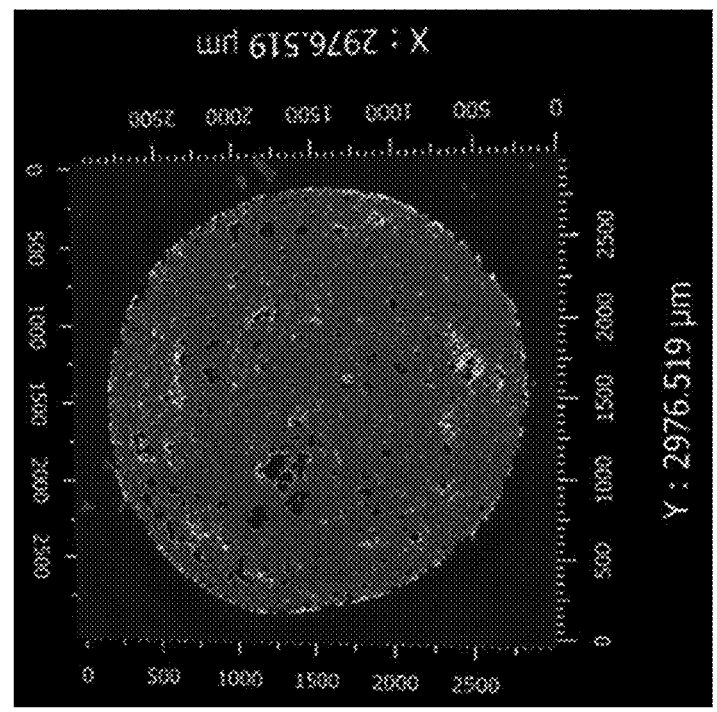
FIG. 7B is an optical profilometer map of distributions of 10 µL Zn NPs deposited on a PI thin film with 5-minute UV-ozone treatment of the film.
Figure 7A:
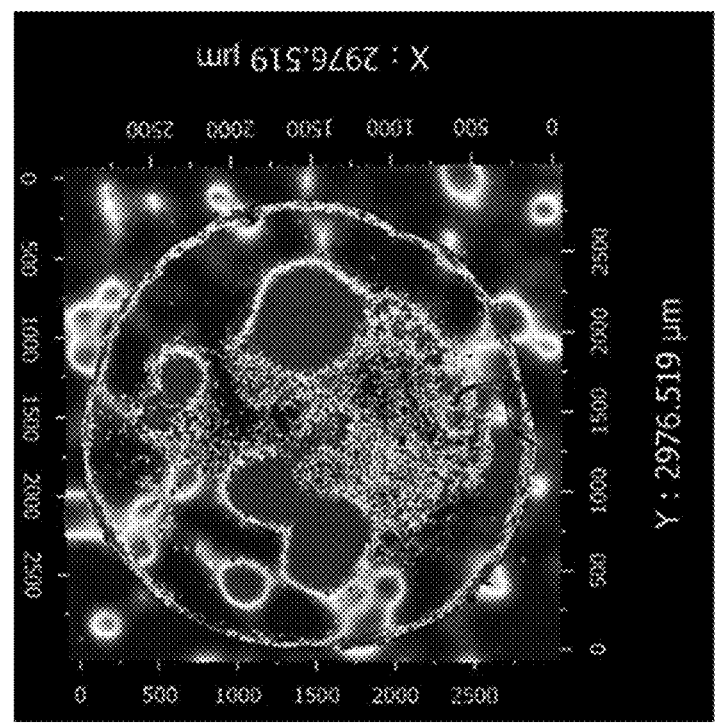
FIG. 7A is an optical profilometer map of distributions of 10 µL Zn NPs deposited on a PI thin film without UV-ozone treatment of the film.

As depicted in FIG. 1B, before depositing the Zn NP ink on the temporary carrier (such as PI film), the surface of the temporary carrier may be exposed to an ozone treatment to enhance the wettability of the temporary carrier layer surface. In certain exemplary implementations, the ozone may be generated by ultra-violate (UV) exposure. Without the ozone treatment, the Zn NPs ink deposited on the PI film can exhibit a significant non-uniform distribution due to the coffee ring effect, as shown in FIG. 7A. In contrast, ozone treatment of the PI film substrate (for approximately 5 minutes) can modify the surface wettability of the PI film to facilitate a relatively uniform distribution of Zn NPs ink on the PI thin film, as shown in FIG. 7B.

FIG. 1C is an example illustration of applying the temporary carrier layer onto the target surface with the Zn NPs layer facing the target substrate with a shadow mask sandwiched between the Zn NPs layer and the target surface.

FIG. 1D is an example illustration of using intense pulsed light (IPL) to induce the mass transfer of Zn from the temporary carrier layer to the target surface, in accordance with an exemplary embodiment of the disclosed technology. The exposure of Zn NPs to the IPL can cause light-induced heating and can increase the temperature of the Zn NPs to result in mass transfer and deposition of the Zn layer on the target surfaces.

FIG. 1E is an example illustration of removal of the shadow mask and temporary carrier layer to leave behind a Zn pattern on the target surface, in accordance with an exemplary embodiment of the disclosed technology.

Figure 2B:
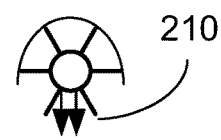
FIG. 2B is an example illustration of using intense pulsed light to induce the mass transfer of Zn from the temporary carrier layer to the freeform 3D target surface, in accordance with an exemplary embodiment of the disclosed technology.
Figure 2B:
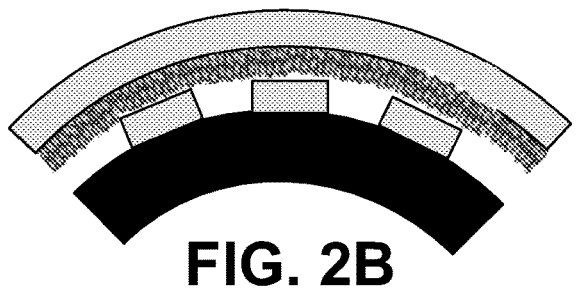

As shown in FIGS. 2A-2D, a similar process (as discussed above) may be utilized for forming a Zn pattern on a freeform three-dimensional (3D) surface. FIG. 2A is an example illustration of the application of the Zn NP coated temporary carrier film 202 onto a freeform 3D target substrate 206 with the Zn NPs layer 204 facing the target substrate 206, and with a shadow mask 208 sandwiched between the Zn NPs layer 204 and the freeform 3D target substrate 206 surface. FIG. 2B is an example illustration of using intense pulsed light 210 to induce the mass transfer of Zn from Zn NPs layer 204 of the temporary carrier film 202 to the freeform 3D target substrate 206, in accordance with an exemplary embodiment of the disclosed technology.

Figure 2C:
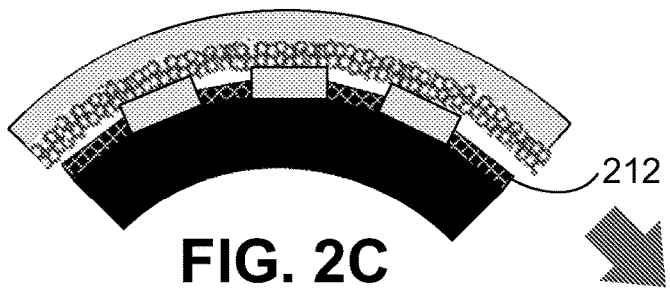
FIG. 2C is an example illustration of Zn transferred to the freeform 3D target surface using intense pulsed light, in accordance with an exemplary embodiment of the disclosed technology.
Figure 2D:
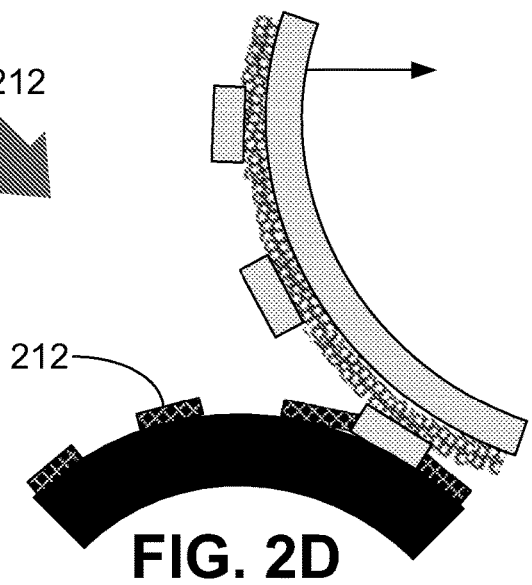
FIG. 2D is an example illustration of removal of the shadow mask and temporary carrier layer to leave behind a Zn pattern on the freeform 3D target surface, in accordance with an exemplary embodiment of the disclosed technology.

FIG. 2C is an example illustration of Zn 212 transferred to the freeform 3D target substrate 206 after exposure to the intense pulsed light 210, in accordance with an exemplary embodiment of the disclosed technology. FIG. 2D is an example illustration of removal of the shadow mask 208 and temporary carrier film 202 to leave behind a Zn 212 pattern on the freeform 3D target substrate 206 surface, in accordance with an exemplary embodiment of the disclosed technology.

Figure 3A:
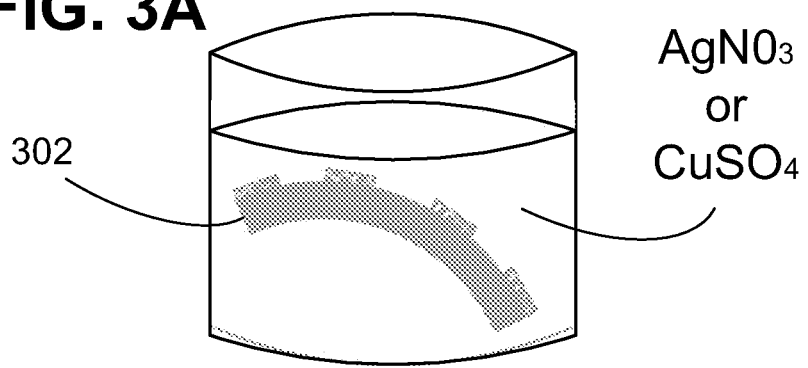
FIG. 3A is an illustration of a Zn patterned freeform 3D target surface immersed in a solution of saturated $AgNO_3$ or $CuSO_4$ to convert the Zn-based device into a long-lasting device through a single replacement reaction of Zn with Ag or Cu formed on the 3D freeform surface, in accordance with an exemplary embodiment of the disclosed technology.

FIG. 3A is an illustration of a Zn patterned freeform 3D target substrate 302 immersed in a solution of saturated silver nitrate (AgNO3) or copper sulfate (CuSO4) to convert the Zn-based device into a long-lasting device through a single replacement reaction of Zn with Ag or Cu formed on the 3D freeform surface, in accordance with an exemplary embodiment of the disclosed technology. In certain exemplary implementations, the resulting long-lasting copper or silver layer formed by the single replacement reaction may be further processed to enhance the conductivity after an additional photonic sintering process.

Figure 3B:
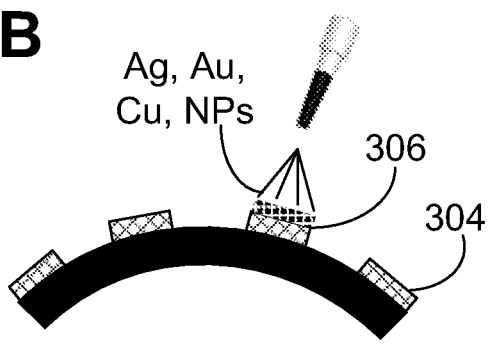
FIG. 3B is an illustration of selectively coating the replacement layer with an additional layer of Ag, Au, or Cu NPs, in accordance with an exemplary embodiment of the disclosed technology.

FIG. 3B is an illustration of selectively coating the replacement layer 304 with an additional layer of Ag, Au, or Cu NPs 306, in accordance with an exemplary embodiment of the disclosed technology.

Figure 3C:
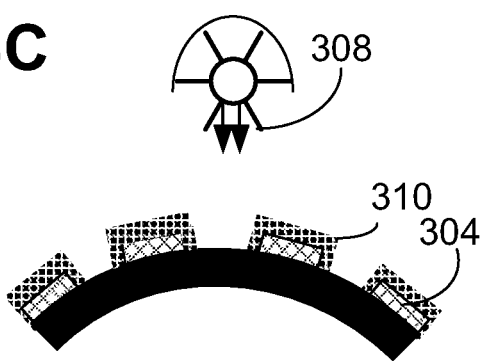
FIG. 3C is an illustration photonic sintering the coated replacement layer, in accordance with an exemplary embodiment of the disclosed technology.

FIG. 3C is an illustration of photonic sintering 308 the coated replacement layer 304 to enhance the conductivity and/or to encapsulate 310 the conductive patterns 304, in accordance with an exemplary embodiment of the disclosed technology.

Embodiments of the deposition method disclosed herein can be used to prepare functional circuits on 3D freeform surfaces (as illustrated in FIGS. 2A-2D) and/or planar surfaces (as illustrated in FIGS. 1C-1E) opening up a wide variety of applications in which various types of sensing circuits (either transient or long-lasting) can be directly fabricated in a fast and convenient way on a multitude of target surfaces, including but not limited to biological surfaces (such as seashells, skin, etc.), non-planar surfaces (bottles, beakers, etc.) and/or planar surfaces.

Certain exemplary implementations of the disclosed technology may enable a new class of smart Internet-of-Things (IoT) devices, in which a network of physical objects with embedded electronics, sensors, or software may communicate with each other. Devices may be fabricated on various objects with complicated shapes using the disclosed technology to enable sensing, communicating, energy harvesting, actuating, controlling, and/or responding in applications including (but not limited to) transport, healthcare, and energy.

Figure 4:
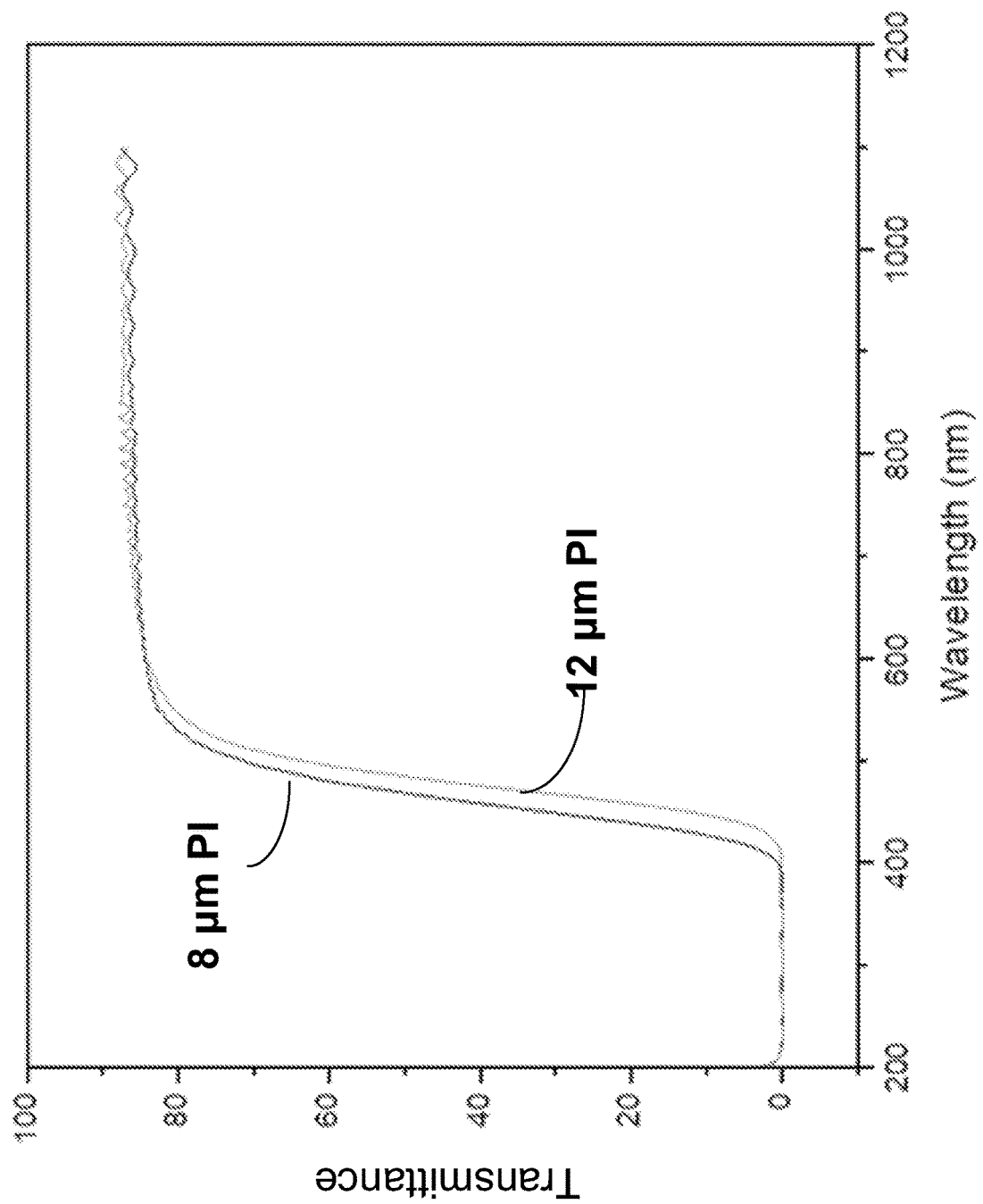
FIG. 4 shows the transmittance as a function of wavelength of polyimide (PI) films with different thicknesses within a wavelength range of 200 nm to 1100 nm, in accordance with an exemplary embodiment of the disclosed technology.

FIG. 4 shows the transmittance as a function of wavelength of polyimide (PI) films for two different thicknesses (8 microns and 12 microns) within a wavelength range of 200 nm to 1100 nm, in accordance with an exemplary embodiment of the disclosed technology.

Figure 5:
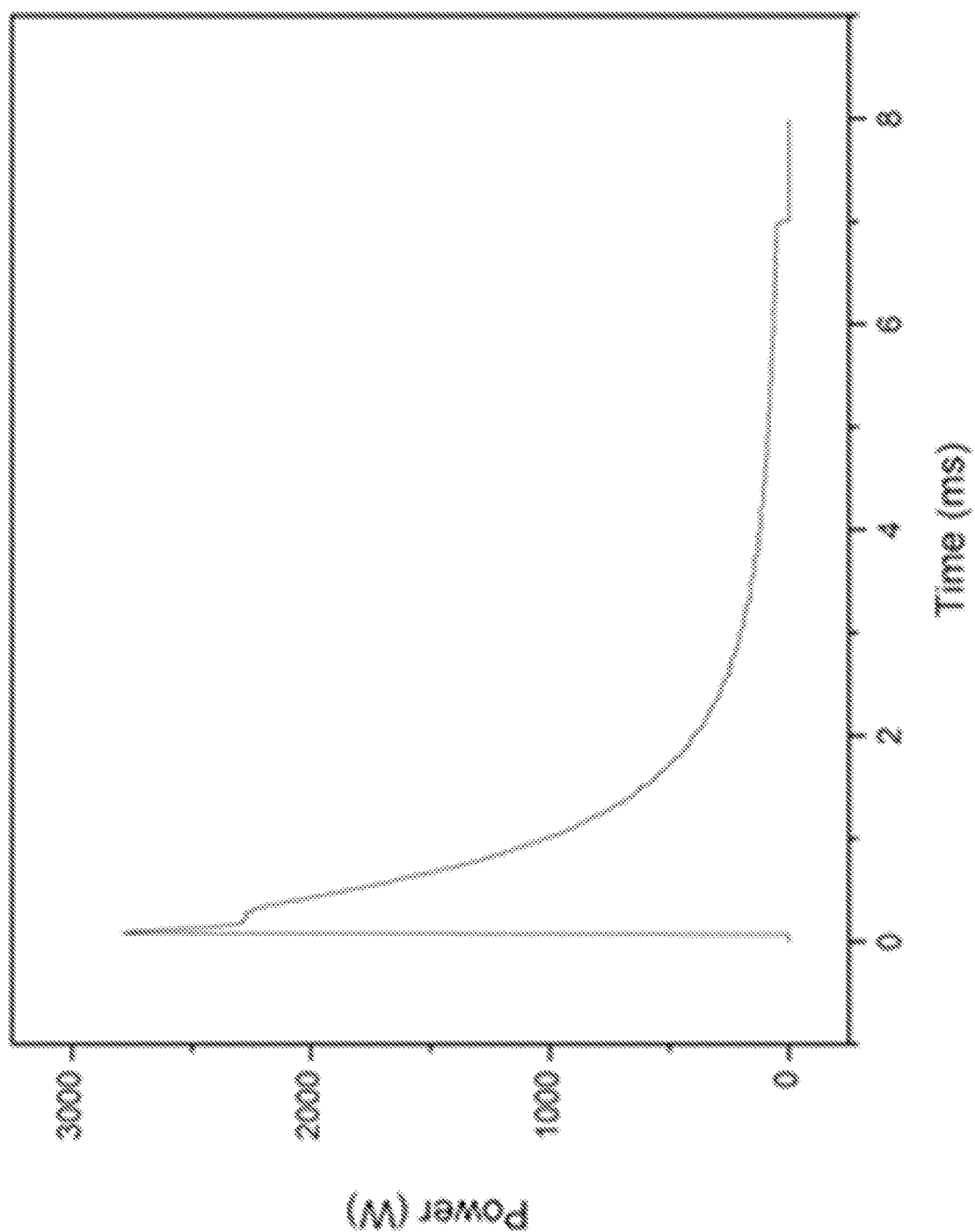
FIG. 5 shows the power output profile from Xenon X-1100 over the on-time of 7 ms, in accordance with an exemplary embodiment of the disclosed technology.

FIG. 5 shows a measured power output power profile from a Xenon™-brand high-intensity pulsed light system (model X-1100) over an on-time of 7 ms, in accordance with an exemplary embodiment of the disclosed technology. While other light sources may be utilized, a xenon source can generate light with a spectrum that extends from the deep UV to the near IR, with peak pulse powers that can often be measured in megawatts. Such light sources may be ideally suited to perform the mass transfer of Zn NPs (or other metal NPs) to the target substrate surface. Furthermore, the same light source may be used for sintering, for example, as discussed above with reference to FIG. 3C. In certain implementations, tight control of high peak powers may be controlled the pulse durations. According to certain exemplary implementations of the disclosed technology, a motorized stage in a roll-to-roll configuration may be utilized with a light source for sequential mass transfer processing of different areas of a large target substrate.

In accordance with certain exemplary implementations of the disclosed technology, intense pulsed light (for example, generated by the xenon source discussed above) can provide a strong light exposure to the Zn NPs through the temporary carrier layer within milliseconds for a total on-time of about 7 milliseconds. As shown in FIG. 5, the output power rapidly increases to the highest level within 1 millisecond, followed by a sharp decrease over time. The short period of exposure of the Zn NPs to the high-intensity light transiently raises their local temperature to be above their melting point, causing the evaporation of Zn beneath its surface oxide (i.e., ZnO shell). The evaporated Zn atoms are then transported through the opening in the patterned shadow mask 208 and condense at the surface of the target substrate 206 as depicted in FIGS. 2B-2C. Removing the shadow mask and the temporary carrier layer may complete a stage of fabrication of the conductive Zn pattern on the surface of the target substrate 206.

As discussed above with reference to FIG. 1A, FIG. 6 shows how a surfactant (such as polyvinylpyrrolidone (PVP)) may enhance the distribution of Zn NPs within the Zn NP ink. As shown in the photo of FIG. 6, sedimentation can occur in a Zn NPs ink solution without the addition of PVP (left), whereas the Zn NPs ink with PVP (right) remains homogeneous.

As discussed above with reference to FIG. 1B, the temporary carrier film may be treated with ozone before applying the Zn NP ink to yield a uniformly coated temporary carrier layer, in accordance with an exemplary embodiment of the disclosed technology. FIG. 7A is an optical profilometer map of distributions of 10 μL Zn NPs deposited on a PI thin film without UV-ozone treatment of the film. FIG.

7B is an optical profilometer map of distributions of 10 μL Zn NPs deposited on a PI thin film with 5-minute UV-ozone treatment of the film. Certain implementations of the disclosed technology may utilize ozone treatment of the temporary carrier to enhance its surface wettability, resulting in a more uniform distribution of the Zn NP ink on the surface.

Figure 8:
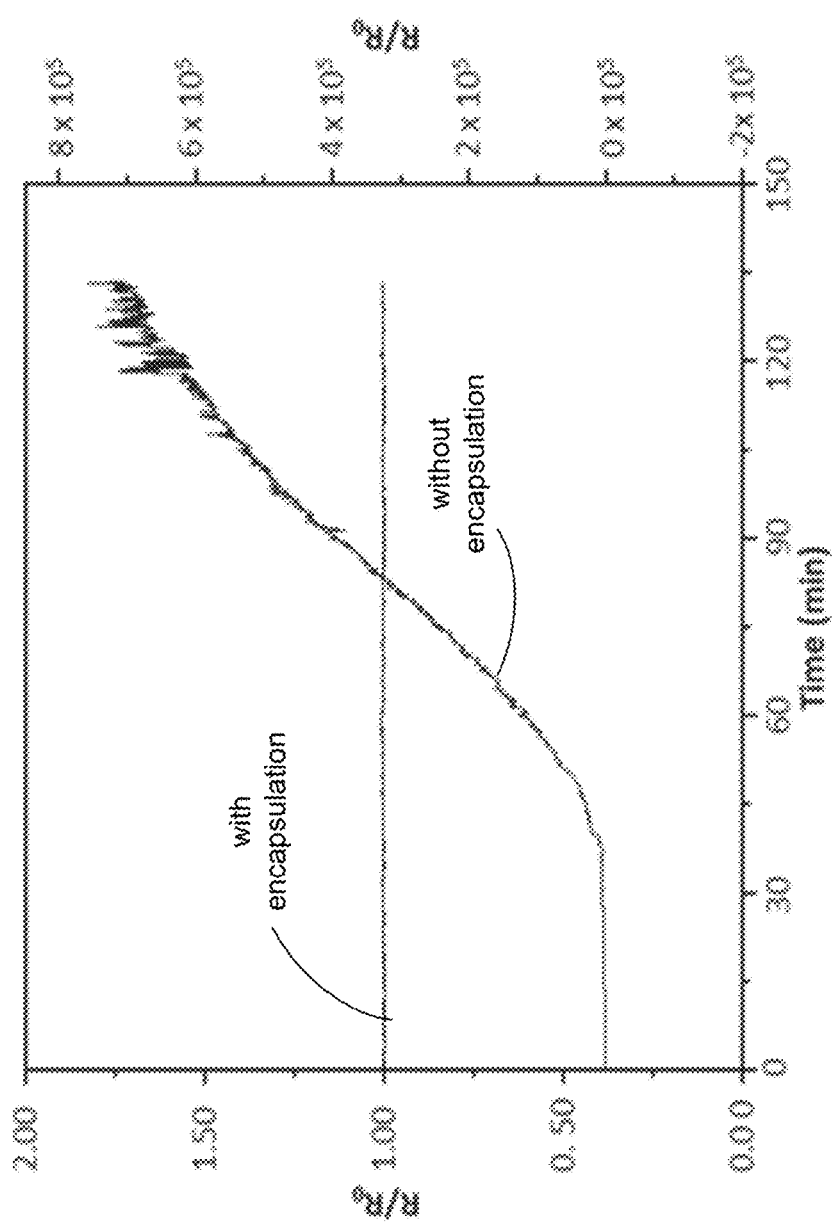
FIG. 8 shows a resistance change of the Zn layer over time with and without encapsulation, in accordance with certain exemplary implementations of the disclosed technology.

As discussed above with reference to FIGS. 3B-3C, encapsulation of the Zn pattern may be used to control its resistance over time. FIG. 8, for example, shows a resistance change of the Zn layer over time with and without encapsulation, in accordance with certain exemplary implementations of the disclosed technology.

The disclosed technology may enable a simple and versatile method to evaporate conductive Zn patterns conveniently and quickly onto various types of substrate surfaces, including but not limited to glass slides, polystyrene (PS) Petri dishes, polyethylene terephthalate (PET) thin films, and PI thin films. The thermal properties and transparency of the temporary carrier layer may affect the actual photonic energy absorbed by Zn NPs and the local temperature of Zn NPs, respectively. Since the local heating of the Zn NPs is strongly associated with the photonic energy absorbed by the Zn NPs, the energy of the IPL may also be used as a parameter in the process.

Because of its effects on the absorbed photonic energy and heat conduction, the concentration of Zn NPs in the Zn NPs ink and/or the layer thickness of Zn NPs on the temporary carrier may also be used as process parameters, according to certain exemplary implementations.

The effect of Zn NPs concentration in the Zn NP ink was investigated using three different Zn NPs concentrations (i.e., 20%, 25%, and 30%) prepared and dispensed on the PI film of 8 μm. Gradually increasing the power of the xenon light resulted in increased conductivity of the deposited Zn layer for all three types of Zn NPs ink. The Zn NPs ink with concentrations of 25% or 20% exhibits a significantly higher conductivity than that of 30%. Such a phenomenon may result from the difference in the Zn NPs layer thickness. As measured by the optical profilometer, the thickness of the Zn NPs layer on the PI thin film increases from 3 μm to 7 μm as the concentration of the Zn NPs ink increases from 20% to 30%. Because the photonic energy is mainly absorbed by the Zn NPs close to the Zn/PI interface, a thicker Zn NPs layer may impede the escape of Zn atoms from inside to the top surface.

While the highest conductivity of the Zn layer from the IPLMT process (i.e., $3.5 \times 10^5$ S/m) is about 2% of its bulk counterpart (i.e., $1.81 \times 10^7$ S/m), it is already 15% of that of sputtered Zn ($2.3 \times 10^6$) and 35% of E-beam evaporated Zn ($1 \times 10^6$). Such a conductivity of the Zn layer from the IPLMT process ranks top among other fabrication processes for Zn based transient electronics, and no significant difference of conductivity was observed for the Zn layers deposited onto a variety of different target substrates, including glass, PS, PET, and PI, indicating the versatility of the IPLMT process.

Certain exemplary implementations of the disclosed technology may utilize controllable degradation of a Zn layer formed by one or more of the IPLMT processes disclosed herein. In the following discussion, the Zn NPs ink with a concentration of 25 wt % on the temporary PI carrier layer of 8 μm exposed to a xenon light energy of 2400 J was used in the IPLMT deposition of Zn for test devices on a glass vial as the target surface and the dissolution of the Zn from the IPLMT process was investigated to determine its functional degradation. Because the dissolution rate of Zn is relatively fast, the Zn-based electronics can only operate for less than a few hours before breakdown after their immersion in water. Though such a quick dissolution process makes Zn an ideal material candidate for devices with temporary use purposes, the oxidation of non-encapsulated Zn can happen quickly in the ambient environment.

As discussed above with reference to FIGS. 3A-3C, long-lasting Ag (or Cu) electrodes may be made to exhibit a much smaller variation in the resistance than that of the transient Zn electrodes. Certain implementations may utilize an encapsulation layer to provide controllable degradation or to prevent degradation, as discussed with reference to FIG. 8. As a demonstration, Zn-based resistors were fabricated with the IPLMT on the outer surface of a glass vial, with one encapsulated by a water barrier layer (PDMS) and the other without. In certain exemplary implementations, the encapsulation layer may utilize degradable polymers, including poly(lactic-co-glycolic acid) (PLGA), polyalkylcyanoacrylates (PACA), poly(ε-caprolactone) (PCL), galactomannan, etc. After the resistors were immersed in water at room temperature, their resistances were constantly monitored by a digital multimeter to inform the degradation process. While the Zn-based resistor without encapsulation can only function for about 40 mins after immersion in water (followed by a gradual increase in the resistance to indicate its breakdown (See FIG. 8), the resistor with encapsulation shows negligible resistance change during the test.

Easy removal of the Zn-based sensors (without encapsulation) was also demonstrated by wiping off the sensor with gloves after taking it out from the water. While the PDMS layer was explored as an encapsulation layer, it can be easily replaced with other transient or biodegradable thin films, whose thickness or choice can help program the operation time of Zn-based transient electronics.

In accordance with certain exemplary implementations of the disclosed technology, transient sensors based on the Zn from the IPLMT process may exhibit high-fidelity performance, comparable with conventional counterparts. The disclosed technology may enable making sensors and electrodes to monitor electrophysiological signals such as an electrocardiogram (ECG) and electromyogram (EMG). For example, after depositing the Zn pattern from the IPLMT process on polyvinyl alcohol (PVA) thin films, the sensors can be pliably attached to the skin surface. The pliable attachment with a strong adhesion may be achieved through a partial dissolution and softening of the PVA thin film to conformally adhere to the textured skin surface. The deposition of the Zn on the PVA thin film may change its surface roughness. The partial dissolution of the PVA beneath the transient electrodes may replicate the microstructures of the skin surface, allowing conformal contact between the electrode and skin. The improved contact quality at the electrode/skin interface may ensure a good signal-to-noise ratio (SNR) for both ECG and EMG signals. After use, the transient sensor may easily be detached from the skin surface by dissolving it in water.

While the thickness and choice of the encapsulation layer material can be utilized to program the operation time for Zn-based transient electronics, demand still exists for long-lasting electronics on a 3D freeform surface. As discussed above with reference to FIGS. 3A-3C, the disclosed IPLMT process may be utilized to pattern noble metal such as copper (Cu) and silver (Ag) on a 3D freeform surface using a single-replacement reaction to replace the evaporated Zn layer with Ag or Cu. In accordance with certain exemplary implementations of the disclosed technology, a Zn layer may be first prepared onto a target substrate surface by the IPLMT method. The substitution of Zn with Ag or Cu may be achieved by immersing the target substrate 302 with Zn patterns in the saturated silver nitrate (AgNO3) and/or copper sulfate (CuSO4) solution for about 1 minute. While the Zn pattern can be successfully replaced by Ag or Cu, a significant resistance increase may be observed, possibly due to the loose interconnection between the Ag or Cu dendrite formed during the single replacement reaction. The conductivity may be enhanced, according to certain example implementations, by photonic sintering of the replaced Ag layer by a xenon light energy of about 900 J. Experiments show the successful decrease of the associated resistance by three orders of magnitude (from ~2.0 MΩ to ~2.5 kΩ) using this method. Other than direct sintering of the noble metal dendrite, coating of the Ag NPs ink (JS-A191, Novacentrix) on the replaced Cu layer can also be achieved through a picoliter dispenser (Microplotter, Sonoplot) due to the increased wettability of the Cu dendrite layer. Sintering of the coated Ag NPs ink on top of Cu may result in resistance of less than 10Ω that is much lower than the original Zn layer and the replaced Ag layer.

The underlying mechanism behind the IPLMT process was investigated by taking scanning electron microscope (SEM) images for both the temporary PI carrier layer and the target surface. Compared to the solid Zn NPs before exposure to intense pulsed light, hollow spheres of the NPs were observed on the temporary PI carrier layer after the IPLMT process, which may imply that the Zn evaporates from the core of the NPs, leaving behind the native oxide shells. These observations indicate the escape of Zn atoms in the core of Zn NPs through the pre-existing cracks of the ZnO shell, which may result from the mismatch in the coefficients of thermal expansion between Zn and ZnO during the heating process. The Zn evaporation and PI decomposition also partially support the existence of transient high temperature at the Zn/PI interface.

As discussed in the provisional patent application 63/193,821, and also in Yi, et al., "Fabricating functional circuits on 3D freeform surfaces via intense pulsed light-induced zinc mass transfer," Materials Today, Volume 50, 2021, Pages 24-34, which are incorporated herein by reference as if presented in full, various multifunctional electric circuits fabricated on a 3D glass beaker using the disclosed technology have been investigated to demonstrate the viability of the disclosed technology. Devices including a dipole antenna, electrodes for ECG measurements, a humidity sensor, a temperature sensor, and corresponding pads for the connection have been fabricated by laminating a kirigami-patterned soft semi-transparent PI film with Zn NPs on surfaces of a glass beaker. Multiple exposures using IPLMT using the techniques disclosed herein resulted in the deposition of Zn onto both the bottom and sidewall of the glass beaker. Follow-up Ag NPs replacement and photonic sintering processes were carried out to convert transient Zn regions into long-lasting Ag regions, resulting in a smart beaker. The performance of each sensing element in the multifunctional circuit compares favorably against their commercial counterparts. For example, a comparison of ECG signals collected from the smart beaker and commercial gel electrodes attached to the wrist of the human subject indicates a slight baseline shift from the former, likely ascribed to different contact impedance at the electrode interface. Though the ECG signal from the smart beaker exhibits a slightly smaller signal-to-noise ratio (SNR) compared to that of the commercial gels, the relevant signal is still evident and sufficient for clinical diagnostics.

An interdigitated electrode (IDE) ZnO-based humidity sensor was also fabricated on the glass beaker using the disclosed techniques to investigate the viability of such devices. Calibration and testing of the humidity sensor were accomplished by placing the smart beaker inside a controlled chamber with a given relative humidity (RH) level (i.e., 49% RH, 55% RH, 59% RH, 66% RH, or 72% RH) for 2 minutes. The humidity sensor on the glass beaker linearly increased with the increasing RH level with a sensitivity of 0.51%/RH %. The humidity sensor also exhibited a good response (~ 2 min) and fast recovery rate (<20 s) at room temperature.

Humidity sensors with Zn and Ag circuit traces respectively were fabricated with the IPLMT method and exposed in a humid environment (75% RH at room temperature) over five days to demonstrate the stability of the humidity sensor. The humidity sensor with conductive Ag traces demonstrated a smaller variation in the relative resistance compared with conductive Zn traces, indicating the rate of oxidation in the conductive Zn lines and an indication of the benefit that an encapsulation layer may provide, as discussed with reference to FIG. 8.

The disclosed technology was further utilized to fabricate a dipole antenna on the sidewall on the above-referenced glass beaker to demonstrate to detection of the level of water in the beaker by measuring a shift in the resonance frequency of the dipole antenna. The measured resonant frequency of the fabricated antenna device shifted to a lower value as the beaker was filled with water (due to the change of the permittivity in the dielectric environment) demonstrating the viability of the disclosed technology for such devices.

Compared to the direct patterning of noble metal NPs ink on the curved surface through conventional 3D printing, the IPLMT-based method disclosed herein is more rapid, lower-cost, and more efficient because it does not require a high-resolution scanner and motor control system as those used in the direct printing methods. One benefit of the disclosed technology is that it can take advantage of the difference in surface wettability between the replaced Cu and the surrounding areas, which allows the Ag NP ink to directly wet and quickly spread over the replaced Cu pattern with clearly defined edges due to the capillary force.

The successful fabrication of circuits on a 3D glass beaker demonstrates the potential of IPLMT for smart IoTs, but the application of IPLMT on certain biological surfaces can still be challenging due to their complicated surface morphologies. Direct fabrication of circuits on biological surfaces may enable a wide range of applications including, but not limited to devices that can include environmental monitors, wireless communication modules, etc.

To explore the viability of the disclosed technology and application of IPLMT for biological surfaces, a set of transient Zn circuit components (like those discussed above with reference to the glass beaker) were fabricated on the complex surface of a seashell using the IPLMT method. A shadow mask was fabricated by $CO_2$ laser cutting of Kapton (PI). The resolution of the transferred Zn pattern using the $CO_2$ laser-cut mask was limited by the resolution of the shadow mask. Certain implementations of the disclosed technology may exploit a higher-resolution laser cutting tool (e.g., UV or femtosecond laser) to prepare the shadow mask for reducing the feature size of the transferred Zn pattern. The granular morphology of the Zn deposited by the IPLMT process is similar to that of Zn from sputtering or e-beam evaporation. The single replacement reaction of Zn in the AgNO3 solution on the seashell was explored to convert the Zn pattern into Ag, followed by photonic sintering. SEM images taken indicate densification of the photonically sintered Ag, which exhibits a similar morphology as those thermally sintered.

As will be understood by those having skill in the art, the electrical conductivity of the IPLMT-evaporated Zn layer pattern is influenced by its electrical resistance value and pattern dimensional parameters. To explore some of the (adjustable) parameters associated with the formation of the IPLMT-evaporated Zn layer, the effect of the temporary carrier layer thickness on the resulting electrical conductivity of the Zn pattern was investigated by fabricating test devices using three different temporary carrier layers, namely PI films of 8 μm, PI films of 12 μm, and PET films of 3 μm (10 samples each). The test devices were fabricated on a glass substrate to have a "dumbbell" shape of a deposited Zn layer, with a neck width of 4 mm and a neck length of 10 mm. Resistance was measured by a digital multimeter, and an optical profilometer (Zygo) was utilized to scan the thickness of the Zn pattern. As the xenon light energy was gradually increased from 1800 J to 2400 J, the electrical conductivity of the evaporated Zn layer on the PI thin films of 8 μm increased from 0 S/m to $3.2 \times 10^5$ S/m. Because of the significant high local temperature even just at the Zn/PI interface, the PI thin film of 8 μm slightly crumpled from an initially flat shape after the xenon light exposure. In contrast, the PI films of 12 μm did not generate the conductive Zn pattern at all levels of xenon light energy, presumably due to the significantly attenuated photonic energy from their larger thicknesses and increased opacity, and possibly due to a larger heat capacity compared to PI films of 8 μm.

The literature indicates that ZnO NPs with a diameter of 40 nm have a light absorption peak at 361 nm and the light absorption gradually decreases as the wavelength increases. Due to the existence of the native oxide on the surface of Zn NPs, it is reasonable to conclude that the transmittance difference in the PI films with different thicknesses can affect the total energy absorbed by the Zn NPs. Zn NPs layer on the PI films of 12 μm was observed to remain unchanged after the IPL exposure. These observations may help explain why using a 12 μm-thick PI carrier layer for these experiments did not yield a Zn pattern, as a significantly attenuated photonic energy due to the thicker temporary carrier layer can result in a lower local temperature of the Zn NPs such that the evaporation of Zn atoms is not favorable. While the clear PET films of 3 μm may have increased light transmittance and decreased heat capacity, experiments show that the PET thin film is burned into ashes when the xenon light energy level is above 2200 J, which may be ascribed to the significant low glass transition temperature of the PET compared to that of the PI.

Figure 9:
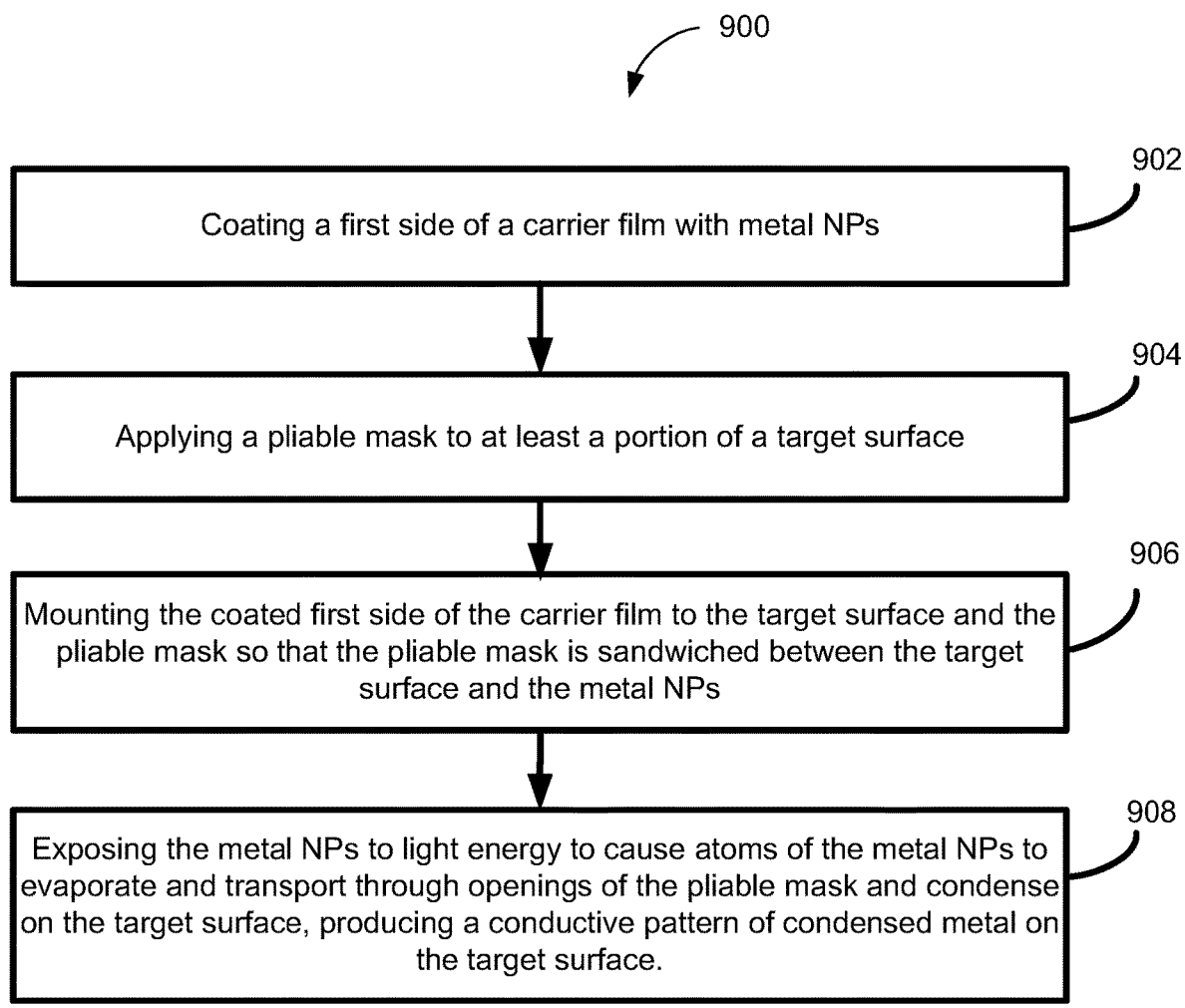
FIG. 9 is a flow diagram of an example method in accordance with an exemplary embodiment of the disclosed technology.

FIG. 9 is a flow diagram of an example method 900 for forming traces for an electronic circuit on a target surface using the intense pulsed light-induced mass transfer (IPLMT) of metal nanoparticles (NPs), in accordance with an exemplary embodiment of the disclosed technology. In block 902, the method 900 includes coating a first side of a carrier film with metal NPs. In block 904, the method 900 includes applying a pliable mask to at least a portion of a target surface. In block 906, the method 900 includes mounting the coated first side of the carrier film to the target surface and the pliable mask so that the pliable mask is sandwiched between the target surface and the metal NPs. In block 908, the method 900 includes exposing the metal NPs to light energy to cause atoms of the metal NPs to evaporate and transport through openings of the pliable mask and condense on the target surface, producing a conductive pattern of condensed metal on the target surface. In certain exemplary implementations, the metal NPs comprises zinc (Zn) NPs.

Certain implementations include removing the pliable mask and carrier film from the target surface while leaving the conductive pattern of condensed metal on the target surface.

Certain exemplary implementations of the disclosed technology can include modifying the surface wettability of the carrier film to facilitate the distribution of the NPs on the carrier film. In some implementations, modifying the surface wettability can include exposing the carrier film to ozone. In certain implementations, exposing the carrier film to ozone can include treating the carrier film with a UV-ozone treatment for 1 to 10 minutes.

In accordance with certain exemplary implementations of the disclosed technology, coating the first side of the carrier film with metal NPs can include preparing and coating the first side of the carrier film with a metal NP ink, wherein the preparation can include dispersing metal NPs in a solvent, and adding a surfactant to the solvent to prevent aggregation of the metal NPs. In certain implementations, the surfactant can include polyvinylpyrrolidone (PVP).

In certain exemplary implementations, applying the metal nanoparticle (NP) ink to the carrier film can include coating the first side of the carrier film with the metal NP ink and evaporating the solvent from the carrier film.

In certain exemplary implementations, coating the first side of the carrier film with the metal NPs can include forming a layer of metal NPs, wherein the layer is characterized by a thickness ranging from 1 μm to 50 μm.

In certain exemplary implementations, exposing the metal NPs to light energy can include irradiating the metal NPs through the carrier film by a xenon lamp. In some implementations, irradiating may be performed for less than 10 ms.

Certain exemplary implementations of the disclosed technology can include removing the pliable mask and carrier film from the target surface while leaving a conductive pattern of condensed metal on the target surface and applying an encapsulation layer to at least a portion of the conductive pattern.

Certain exemplary implementations of the disclosed technology can include converting at least a portion of the conductive pattern to silver (Ag) through a replacement reaction by immersing the conductive pattern in a solution of silver nitrate.

Certain exemplary implementations of the disclosed technology can include converting at least a portion of the conductive pattern to copper (Cu) through a replacement reaction by immersing the conductive pattern in copper sulfate.

Certain exemplary implementations of the disclosed technology can include sintering of the conductive pattern. In some implementations, the sintering may be performed using intense pulsed light from a xenon light source.

In accordance with certain exemplary implementations of the disclosed technology, applying the pliable mask to the target surface can include laminating the pliable mask to a three-dimensional (3D) freeform surface, wherein the pliable mask prevents the application of the metal NPs to one or more regions of the 3D freeform surface covered by the pliable mask.

In accordance with certain exemplary implementations of the disclosed technology, one or more of the pliable mask and the carrier film can include a polyimide film.

In certain exemplary implementations, the pliable mask may include a kirigami-patterned film configured to conform to the target surface.

In certain exemplary implementations, the target surface can include or be coated with one or more of an adhesion material, an electrically conductive material, a semiconductor material, an electrical insulator material, a thermally conductive material, and a thermally non-conductive material.

In certain exemplary implementations, the conductive pattern fabricated using methods and/or materials disclosed herein may include at least two electrically conductive traces that are electrically isolated from one another by at least a portion of the target surface that is masked by the pliable mask.

Certain exemplary implementations of the disclosed technology can further include one or more of annealing, thermally treating, and mechanically treating at least a portion of the conductive pattern to enhance thermal and mechanical properties and to enhance binding with one or more of external metal wires, C4 micro-bumps of a chip, pins, and metal leads.

Certain implementations of the disclosed technology can include an electronic circuit that can include a pattern of electrically conductive traces formed on a three-dimensional (3D) structure, the traces defined by openings in a kirigami-patterned mask mounted to a surface of the 3D structure. At least a portion of the pattern of electrically conductive traces can include one or more of: zinc (Zn) formed by intense pulsed light-induced mass transfer of Zn nanoparticles (NPs) to the surface of the 3D structure; silver (Ag) formed through a replacement reaction by immersing the conductive pattern in a solution of silver nitrate; and copper (Cu) formed through a replacement reaction by immersing the conductive pattern in copper sulfate.

In accordance with certain exemplary implementations of the disclosed technology, at least a portion of the electrically conductive traces may be sintered to enhance conductivity.

In certain exemplary implementations, at least a portion of the electrically conductive traces may be covered by an encapsulation layer. In certain exemplary implementations, the encapsulation layer can include a controllably degradable polymer.

In accordance with certain exemplary implementations of the disclosed technology, the electrically conductive trace may be one or more of annealed, thermally treated, and mechanically treated to enhance thermal and mechanical properties and to enhance binding with one or more of external metal wires, C4 micro-bumps of a chip, pins, and metal leads.

According to an exemplary implementation of the disclosed technology, the kirigami-patterned mask can include a polyimide film such as Kapton.

Certain exemplary implementations of the disclosed technology may include a controllably transient degradable electronic circuit, which may include a pattern of electrically conductive traces formed on a target surface, the traces defined by openings in a pliable mask mounted to the target surface. In certain exemplary implementations, at least a portion of the pattern of electrically conductive traces can include a metal comprising one or more of Zn, Mg, Mo, and W, formed by intense pulsed light-induced mass transfer (IPLMT) of corresponding one or more Zn, Mg, Mo and W nanoparticles (NPs) to the target surface. In certain exemplary implementations, at least a portion of the pattern of electrically conductive traces can include an encapsulation layer covering at least a portion of the electrically conductive traces. In certain exemplary implementations, the encapsulation layer composition and thickness may be selected based on a decomposition rate.

In certain exemplary implementations, the encapsulation layer can include one or more of poly(lactic-co-glycolic acid) (PLGA), polyalkylcyanoacrylates (PACA), poly(ε-caprolactone) (PCL), and galactomannan.

In certain implementations, the target surface can include skin, for example, of a human or animal.

In accordance with certain exemplary implementations of the disclosed technology, the pattern of electrically conductive traces can include one or more electrodes to monitor electrophysiological signals including electrocardiogram (ECG) and electromyogram (EMG).

In certain exemplary implementations, the electrically conductive traces may be one or more of annealed, thermally treated, and mechanically treated to enhance thermal and mechanical properties and to enhance binding with one or more of external metal wires, C4 micro-bumps of a chip, pins, and metal leads.

According to an exemplary implementation of the disclosed technology, at least a portion of the electrically conductive traces may be sintered to enhance conductivity.

In certain exemplary implementations, the pliable mask can include a kirigami-patterned film configured to conform to the target surface.

In accordance with certain exemplary implementations of the disclosed technology, the IPLMT method disclosed herein can include exposing the one or more NPs to light energy by irradiating the one or more NPs through a carrier film by a xenon lamp.

In certain implementation, the target surface can include or be covered with one or more of an adhesion material, an electrically conductive material, a semiconductor material, an electrical insulator material, a thermally conductive material, and a thermally non-conductive material.

In certain exemplary implementations, the conductive pattern can include at least two electrically conductive traces that are electrically isolated from one another by at least a portion of the target surface that is masked by the pliable mask.

Although preferred embodiments of the disclosed technology are explained in detail, it is to be understood that other embodiments are contemplated. Accordingly, it is not intended that the disclosed technology is limited in its scope to the details of construction and arrangement of components set forth in the following description or illustrated in the drawings. The disclosed technology is capable of other embodiments and of being practiced or carried out in various ways. As used in the specification and the appended claims, the singular forms "a," "an," and "the" include plural referents unless the context clearly dictates otherwise.

It is intended that each term presented herein contemplates its broadest meaning as understood by those skilled in the art and may include all technical equivalents, which operate in a similar manner to accomplish a similar purpose.

Ranges may be expressed herein as from "about" or "approximately" one particular value and/or to "about" or "approximately" another particular value. When such a range is expressed, another embodiment may include from the one particular value and/or to the other particular value. Similarly, values may be expressed herein as "about" or "approximately."

The terms "comprising" or "containing" or "including" means that at least the named element, material, or method step is present in the apparatus or method, but does not exclude the presence of other elements, materials, and/or method steps, even if the other elements, materials, and/or method steps have the same function as what is named.

The term "exemplary" as used herein is intended to mean "example" rather than "best" or "optimum."

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

The example implementation of the disclosed technology may provide the technical effects and/or benefits of enabling the formation of circuitry on complex-shaped 3D structures. The disclosed technology removes certain geometrical limitations and provides certain advantages over traditional planar circuit processing techniques, including but not limited to reducing one or more processing steps. In this respect, certain steps in traditional circuit board processing can be avoided, such as spinning a photoresist on a copper-coated substrate, exposing the photoresist to light, etching the copper, etc.

Numerous characteristics and advantages have been set forth in the foregoing description, together with details of structure and function. While the disclosed technology has been presented in several forms herein, it may be apparent to those skilled in the art that many modifications, additions, and deletions, especially in matters of shape, size, and arrangement of parts, can be made therein without departing from the spirit and scope of the disclosure and its equivalents as set forth in the following claims. Therefore, other modifications or embodiments as may be suggested by the teachings herein are particularly reserved as they fall within the breadth and scope of the claims.

What is claimed is:

1. A method of forming an electronic circuit on a target surface using intense pulsed light-induced mass transfer (IPLMT) of metal nanoparticles (NPs), the method comprising:
   coating a first side of a carrier film with metal NPs;
   applying a pliable mask to at least a portion of a target surface;
   mounting the coated first side of the carrier film to the target surface and the pliable mask so that the pliable mask is sandwiched between the target surface and the metal NPs; and
   exposing the metal NPs to light energy to cause atoms of the metal NPs to evaporate and transport through openings of the pliable mask and condense on the target surface, producing a conductive pattern of condensed metal on the target surface.

2. The method of claim 1, wherein the metal NPs comprises a zinc (Zn) NPs.

3. The method of claim 1, further comprising removing the pliable mask and carrier film from the target surface while leaving the conductive pattern of condensed metal on the target surface.

4. The method of claim 1, further comprising modifying a surface wettability of the carrier film to facilitate distribution of the NPs on the carrier film.

5. The method of claim 4, wherein the modifying the surface wettability comprises exposing the carrier film to ozone.

6. The method of claim 5, wherein exposing the carrier film to ozone comprises treating the carrier film with a UV-ozone treatment for 1 to 10 minutes.

7. The method of claim 1, wherein coating the first side of the carrier film with metal NPs comprises preparing and coating the first side of the carrier film with a metal NP ink, wherein the preparing comprises:
   dispersing metal NPs in a solvent; and
   adding a surfactant to the solvent to prevent aggregation of the metal NPs.

8. The method of claim 7, wherein the surfactant comprises polyvinylpyrrolidone (PVP) and wherein the applying the metal nanoparticle (NP) ink to the carrier film comprises coating the first side of the carrier film with the metal NP ink and evaporating the solvent from the carrier film.

9. The method of claim 1, wherein the pliable mask comprises a kirigami-patterned film configured to conform to the target surface.

* * * * *